(12) United States Patent
Xu et al.

(10) Patent No.: US 12,130,392 B2
(45) Date of Patent: Oct. 29, 2024

(54) HIGH RESOLUTION LIGHT VALVE DETECTOR FOR DETECTING X-RAY

(71) Applicant: Carl Zeiss X-ray Microscopy, Inc., Dublin, CA (US)

(72) Inventors: Xiaochao Xu, Pleasanton, CA (US); Christoph Graf Vom Hagen, Oakland, CA (US)

(73) Assignee: Carl Zeiss X-ray Microscopy Inc., Dublin, CA (US)

( * ) Notice: Subject to any disclaimer, the term of this patent is extended or adjusted under 35 U.S.C. 154(b) by 601 days.

(21) Appl. No.: 17/288,162

(22) PCT Filed: Nov. 5, 2019

(86) PCT No.: PCT/US2019/059916
§ 371 (c)(1),
(2) Date: Apr. 23, 2021

(87) PCT Pub. No.: WO2020/097111
PCT Pub. Date: May 14, 2020

(65) Prior Publication Data
US 2021/0311211 A1 Oct. 7, 2021

Related U.S. Application Data

(60) Provisional application No. 62/755,807, filed on Nov. 5, 2018.

(51) Int. Cl.
*G01T 1/24* (2006.01)
*G02B 21/00* (2006.01)
*H01J 37/244* (2006.01)

(52) U.S. Cl.
CPC .......... *G01T 1/246* (2013.01); *G02B 21/0092* (2013.01); *H01J 37/244* (2013.01); *H01J 2237/24415* (2013.01)

(58) Field of Classification Search
CPC ..... A61B 6/032; A61B 6/4007; A61B 6/4028; A61B 6/54; A61B 6/4085; A61B 6/40;
(Continued)

(56) References Cited

U.S. PATENT DOCUMENTS 5,847,499 A * 12/1998 Rieppo .................... H05G 1/64
313/367
6,052,432 A 4/2000 Rieppo et al.
(Continued)

FOREIGN PATENT DOCUMENTS

JP H03-096898 A 4/1991
JP 2003096898 A 4/2003
(Continued)

OTHER PUBLICATIONS

Anonymous, "Reflected Light Microscopy," Carl Zeiss Microscopy Online Campus, 1-7 (2018).
(Continued)

*Primary Examiner* — Irakli Kiknadze
(74) *Attorney, Agent, or Firm* — HoustonHogle LLP (57) ABSTRACT

A detection system for an x-ray microscopy system utilizes high bandgap, direct conversion x-ray detection materials. The signal of the x-ray projection is recorded in a spatial light modulator such as a liquid crystal (LC) light valve. The light valve is then read-out by a polarized light optical microscope. This configuration will mitigate the loss of light in the optical system over the current scintillator-optical microscope-camera detection systems.

20 Claims, 4 Drawing Sheets

(58) Field of Classification Search
CPC ..... A61B 6/4429; A61B 6/4208; A61B 6/582; A61B 6/583; A61B 5/0066; A61B 5/0073; G01N 23/04; G01N 23/046; G01N 2223/419; G01N 2223/616; G01N 2223/03; G01N 2223/50; G01N 21/6458; G01N 15/0227; G01N 15/0211; G01N 15/0205; G01N 21/4795; G01N 21/21; H05G 1/52; H05G 1/64; G01T 1/2985; G01T 1/246; G01T 1/16; G01T 1/2018; G01T 1/2928; G06T 11/005; G06T 11/006; G06T 3/4053; G06T 5/10; G06T 7/80; G06T 5/70; G02F 1/135; G02F 1/1354; G02F 1/1352; G02F 2001/1352; G02F 1/1313; G02F 1/0136; G02F 1/133528; G02F 1/13471; H01J 37/244; H01J 2237/24415; H01J 31/50; G02B 21/0092; G02B 21/008; G02B 21/367; G02B 21/0076; G02B 21/0068; G02B 21/0032; H01L 31/115; H04N 5/32; H04N 5/3597; H04N 5/361; H04N 25/626; H04N 25/63; H04N 23/30; G01J 3/4406; G01J 3/457; G01J 3/0224; G01B 9/02087; G01B 9/02091; G01B 9/02007

See application file for complete search history.

(56) References Cited

U.S. PATENT DOCUMENTS

| | | | |
|---|---|---|---|
| 7,687,792 | B2 | 3/2010 | Rowlands et al. |
| 8,519,347 | B2 | 8/2013 | Kanatzidis et al. |
| 9,348,038 | B2 | 5/2016 | Rowlands et al. |
| 9,671,603 | B2* | 6/2017 | Kalkbrenner ...... G02B 21/0092 |
| 2007/0201616 | A1* | 8/2007 | Rowlands ............. G02F 1/1354 378/98.2 |
| 2015/0103975 | A1* | 4/2015 | Yang ...................... G01N 23/04 378/62 |
| 2016/0252467 | A1* | 9/2016 | Thompson ........... G01N 23/046 378/20 |

FOREIGN PATENT DOCUMENTS

| | | |
|---|---|---|
| JP | 2006248820 A | 9/2006 |
| JP | 2017133964 A | 3/2020 |

OTHER PUBLICATIONS

Aubourg, P., et al., "Liquid Crystal light Valve Bulk Monocrystalline Bi12SiO20 as the Photoconductive Material," Applied Optics, 21(20): 3706-3712 (1982).
Bortolozzo, U., et al., "Adaptive Holography in Liquid Crystal Light-Valves," Materials, 5: 1546-1559 (2012).
MacDougall, R.D., et al., "The x-ray light valve: a low-cost, digital radiographic imaging system—Spatial resolution," Med. Phys., 35(9): 4216-4227 (2008).
Maculan, G., et al., "CH3NH3PbC13 Single Crystals: Inverse Temperature Cyrstallization and Visible-Blind UV-Photodetector," J. Phys. Chem. Lett., 6:3781-3786 (2015).
Matsumoto, S., et al., "Field-induced deformation of hybrid-aligned nematic liquid crystals: New multicolor liquid crystal display," Journal of Applied Physics, 47(9): 3842-3845 (1976).
Oakham, P., et al., "The optimal optical readout for the x-ray light valve—Document scanners," Med. Phys. 35(12): 5672-5683 (2008).
Rieppo, P.-K., et al., "X-ray imaging with amorphous selenium: Theoretical feasibility of the liquid crystal light valve for radiography," Med. Phys. 24(8): 1279-1291 (1997).
Rieppo, P.-K., et al., "An Amorphous Selenium Liquid Crystal Light Valve for X-Ray Imaging," SPIE, 2432: 228-236 (1979).
Szeto, T.C., et al., "The x-ray light valve: a potentially low-cost, digital radiographic imaging system—a liquid crystal cell design for chest radiography," Med. Phys. 35(3): 959-967 (2008).
Tao, L., et al., "Study of material properties important for an optical property modulation-based radiation detection method for positron emission tomography," Journal of Medical Imaging, 4(1): 011010-1-011010-7 (2017).
Webster, C.A., et al., "The x-ray light valve: a potentially low-cost, digital radiographic imaging system-concept and implementation considerations," Med. Phys. 35(3): 939-949 (2008).
International Search Report and Written Opinion of the International Searching Authority, mailed on Apr. 14, 2020, from International Application No. PCT/US2019/059916, filed on Nov. 5, 2019. 10 pages.
International Preliminary Report on Patentability, mailed on May 20, 2021, from International Application No. PCT/US2019/059916, filed on Nov. 5, 2019. 8 pages.

* cited by examiner

HIGH RESOLUTION LIGHT VALVE DETECTOR FOR DETECTING X-RAY

RELATED APPLICATIONS

This application is a § 371 National Phase Application of International Application No. PCT/US2019/059916, filed on Nov. 5, 2019, now International Publication No. WO 2020/097111 A1, published on May 14, 2020, which International Application claims the benefit under 35 USC 119(e) of U.S. Provisional Application No. 62/755,807, filed on Nov. 5, 2018, both of which are incorporated herein by reference in their entirety.

BACKGROUND OF THE INVENTION

X-ray microscopy and other applications require the detection of x-ray photons (<500 keV) with high spatial resolution and high efficiency.

Some current x-ray microscopes utilize optical coupling of a thin scintillator detector to a charge coupled device (CCD) or complementary metal oxide semiconductor (CMOS) camera via an optical microscope. This setup enables high-resolution imaging.

SUMMARY OF THE INVENTION

The optical coupling in scintillator-optical microscope-camera detection systems is not perfect, however. The light collection efficiency is limited because of the finite object NA and light loss in the optical microscope. This results in a reduction in Detective Quantum Efficiency (DQE) for the x-ray detection (the so-called quantum sink) and the direct consequence is a reduction in the imaging throughput.

The present invention concerns detection systems for detecting x-rays or high energy charged particle beams that utilize high bandgap, direct conversion detection materials. The signal of the x-ray, for example, projection is recorded in a spatial light modulator, such as a liquid crystal (LC) light valve. The light valve is then illuminated by an external light source of an optical microscope. This configuration will mitigate the loss of light in the optical system over the current scintillator-optical microscope-camera detection systems.

In addition, the imaging camera of the optical microscope does not need to be a high-end, expensive cooled camera. As a result, the proposed detection system can be lower cost.

The present detection system employs a photoconductive x-ray detector that has a sandwich structure comprised of a high bandgap direct conversion x-ray detection photoconductor layer and a spatial light modulator such as a liquid crystal (LC) light valve. During operation, the LC film of LC light valve is exposed to an electric field. The x-ray photons will then generate electron-hole pairs in the photoconductor layer and thus locally modify the electrical field. This local field will create a local reorientation of the liquid crystals in the adjacent LC film. This can be detected by polarized light optical microscope, for example.

In general, according to one aspect, the invention features a detection system for an x-ray or charged particle beam analysis system. The detection system comprises a photoconductive detector and an optical microscope for reading out the photoconductive detector.

In current embodiments, the photoconductive detector comprises a liquid crystal electro-optic light modulator and photoconductive detector layer. This photoconductive detector layer preferably includes a high Z element such as bismuth, lead, thallium, mercury, tellurium, antimony or tin.

The optical microscope is preferably a polarization light microscope that reads-out the photoconductive x-ray detector in transmission or in reflection.

In general, according to another aspect, the invention features a detection system for an imaging system, comprising a photoconductive detector and an optical microscope for reading out the photoconductive detector.

The system might be an x-ray microscopy system or a macroscopy x-ray imaging system.

In other cases, photoconductive detector detects particles such as charged particles of a charged particle beam.

The optical microscope can read-out the photoconductive detector in transmission or reflection.

In general, according to another aspect, the invention features an analysis system, comprising a source for generating a beam, an object stage system for holding and rotating an object in the beam, and a detection system including a photoconductive detector and an optical microscope for reading out the photoconductive detector.

The above and other features of the invention including various novel details of construction and combinations of parts, and other advantages, will now be more particularly described with reference to the accompanying drawings and pointed out in any claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
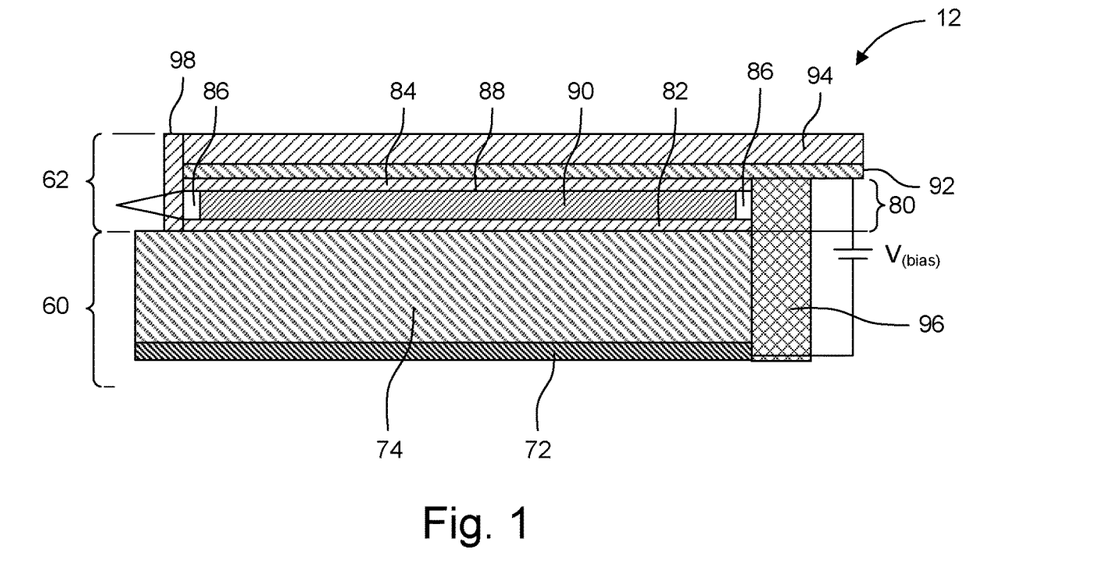
FIG. 1 is a cross-sectional view in side elevation of a photoconductive x-ray detector forming part of the x-ray image intensifier according to the present invention.

FIG. 1 shows the basic setup of the photoconductive x-ray detector 12. It comprises an electro-optic spatial light modulator such as an LC electro-optic light modulator 62 disposed on one side of a photoconductive detector 60.

The photoconductive detector 60 includes a transparent, conductive Indium Tin Oxide (ITO) electrode 72 deposited on a photoconductor layer 74 having a thickness in the range of about 5 to 1000 μm.

The electro-optic light modulator 62 is in the form of a liquid crystal (LC) cell 80. The LC cell 80 includes a pair of alignment layers 82 and 84. Alignment layer 82 might be deposited on the photoconductor layer 74 using spin coating techniques. Spacers 86 act between the polyimide alignment layers to maintain a uniform separation between the polyimide alignment layers 82 and 84 and thus define an LC cavity 88.

The doped nematic liquid crystal material 90 fills the LC cavity 88 and can be introduced by a vacuum fill technique to avoid air bubble formation in the liquid crystal material. An ITO electrode 92 overlies the alignment layer 84 while a glass substrate 94 overlies the ITO electrode 92. The ITO electrode 92 and the glass substrate 94 overhang the photoconductive detector layer 60 to facilitate connection of a potential source V(bias) between the ITO electrodes 92 and 72 respectively.

The LC cell 80 is constructed in a similar manner to self-standing LC cells with the exception that the LC cell is defined by a glass substrate and the photoconductor layer 74 as opposed to a pair of glass substrates.

Epoxy 96 acts between the ITO electrodes 92 and 72 to fill areas between the ITO electrodes separated by air and inhibit breakdown of the LC cell 80 when a potential is placed across the ITO electrodes. Epoxy 98 also seals the electro-optic light modulator 58 to inhibit separation of the layers forming the photoconductive x-ray detector 12.

In the past, most have used amorphous selenium (a-Se) as the photoconductor layer 74.

In contrast, in the preferred embodiment, the photoconductor layer 74 is fabricated from a material that has both a high-bandgap and high electrical resistivity. The advantage of high-bandgap photoconductors is that they normally produce a much smaller leaking current under a high-voltage bias. This is important in reducing the detector noise. In addition, it will simplify and stabilize the performance of the LC light valve. It also simplifies the analysis and modelling of the detector system.

In one embodiment of the present invention, the photoconductor layer 74 is monocrystalline bismuth silicon oxide $Bi_{12}SiO_{20}$ (BSO) or (chemically similar) crystal bismuth germanium oxide $Bi_{12}GeO_{20}$ (BGO) or bismuth titanium oxide $Bi_{12}TiO_{20}$ (BTO).

In other embodiments, the high bandgap material of the photoconductor layer 74 is a lead-based high bandgap perovskite material such as methylammonium lead halide ($MAPbX_3$, X=I, Br and Cl), formamidinium lead halide ($FAPbX_3$) and cesium lead halide ($CsPbX_3$).

In other embodiments, the high bandgap material of the photoconductor layer 74 is one of the materials described in Mercouri G. Kanatzidis, Ioannis Androulakis, Simon Johnsen, Sebastian C. Peter. Methods and compositions for the detection of X-ray and gamma-ray radiation. See U.S. Pat. No. 8,519,347, which is incorporated herein by this reference.

It has been shown in Tao L, Daghighian H M, Levin C S. Study of material properties important for an optical property modulation-based radiation detection method for positron emission tomography. *J Med Imaging* (Bellingham). 2017; 4(1):011010 that BSO can produce detectible signals from radioisotope illumination (which normally produces a much lower x-ray photon flux than an x-ray tube does). However, we think their method of detecting the signals is not feasible and/or practical as an area detector. Instead, we believe an x-ray light valve configuration will provide a feasible and practical solution to extract the signals generated by a BSO crystal with high spatial resolution. It should be noted that light valve devices with BSO crystals have been proposed in Aubourg P, Huignard J-P, Hareng M, Mullen R. Liquid crystal light valve using bulk monocrystalline $Bi_{12}SiO_{20}$ as the photoconductive material. *Applied Optics*. 1982; 21(20):3706-3712. Bortolozzo U, Residori S, Huignard J-P. Adaptive Holography in Liquid Crystal Light-Valves. *Materials*. 2012; 5(9):1546. However, these light valve devices were used as light modulators only and not as x-ray detectors.

There are several benefits to choosing these photoconductors. All of them contain high-Z materials (for example, Z=83 for Bismuth and Z=82 for lead). This will enhance the x-ray absorption because the photoelectric cross section (absorption power) is proportional to approximately $Z^4$, and photoelectric interactions are dominated in our x-ray energy range (which are x-rays of a few keV to a few hundred keV) and desirable over other types of interactions like Compton scattering. In addition, these high-Z materials normally have higher densities than low-Z materials like a-Se. However, comparing to the Z difference, this will be of a relative minor effect.

A few other examples of high-bandgap materials for the photoconductor layer 74 are: ZnTe, ZnSe, HgS, TlBr, $HgI_2$ and mercurous halides materials such as $Hg_2I_2$, $Hg_2Br_2$ and $Hg_2Cl_2$. in "H. Chen, J.-S. Kim, F. Jin, and S. Trivedi, "Detection of nuclear radiation via mercurous halides," US Patent Application Pub. No. 2016/0216384.

Figure 2:
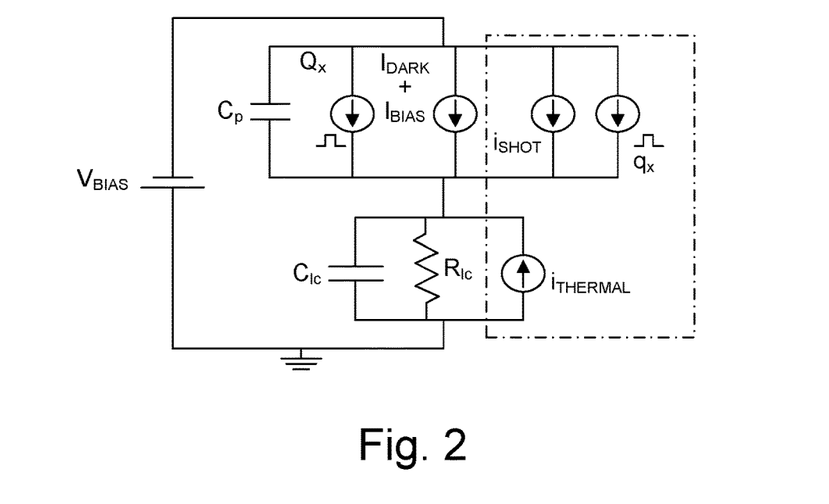
FIG. 2 is a schematic of an equivalent electrical circuit of the photoconductive x-ray detector of FIG. 1.

FIG. 2 shows the effective circuit of the x-ray light valve detector system. As can be seen, the photoconductive detector layer 60 can be represented by a capacitor $C_P$ and a number of current and charge sources all connected in parallel. The LC cell 80 can be represented by a capacitor $C_{lc}$ a resistor $R_{lc}$ and a current source all connected in parallel.

With a proper choice of the LC electrical conductivity (not too small and not too large, but larger than that of the photoconductor), at a steady state without x-ray radiation, the voltage drop over the LC cell is low or close to 0 because its thinness and higher electrical conductivity than the photoconductor.

Another important aspect of the choosing LC conductivity is to set the charge relaxation time of the device. The drift time of the charges in the photoconductor layer 74 is of the order nanosecond to microsecond depending on the material of the photoconductor layer and the bias voltage ($V_{(bias)}$). This normally is much shorter than the interval between consecutive image frames $\tau_f$. After the charges drift to the LC cell 80, they will dissipate relatively slowly, and this dissipation time is mainly determined by the charge relaxation time of the LC cell 80. LC layer relaxation time is $\tau_c = \varepsilon_0 \varepsilon_r / \sigma = R_{lc} C_{lc}$ ($\varepsilon r$ and $\sigma$ are LC dielectric constant and conductivity respectively).

In normal operations, $\tau_f$ should be at least a few times longer than $\tau_c$ to ensure that the charges from the previous frame do not strongly affect the next frame. Basically, the LC cell 80 is acting as the charge resetting resistor and capacitor for this purpose.

In general, $\tau_f$ is less than 1 millisecond (msec) for fast imaging and can be longer than seconds for slow imaging. Also, $\tau_c$ is controlled by doping the LC cell 80 to increase its electric conductivity.

Generally, crystalline photoconductors are preferred over amorphous material like a-Se. The advantage of crystalline materials is that they generally have better materials properties (higher electrical mobility, less charge trapping, etc). And the main advantage of amorphous materials is that it can be made of large area in an inexpensive manner. However, for high-resolution detectors described here, the detectors are generally of small area, therefore, this advantage is not very important here to the present system.

In the past for the LC spacer, some have used microrod spacers (as used in LCD display industry), but such spacers are suitable for lower resolution and large area LC light valve applications.

The proposed x-ray detection system is intended for high resolution, small area LC light valve applications. As such, these microrods/microspheres will be visible. Therefore, some embodiments use the edge spacers 86 at the rims of the LC cavity 88. Preferably, the thickness of the spacers 86 and thus the thickness of the LC cavity 88 is 10 μm or less (for high spatial resolution and large dynamic range in dosage). For the best resolution, the thickness is 1 μm or less. These spacers 86 are preferably deposited or otherwise fabricated on the substrate 94 in FIG. 1) before or after the deposition of the alignment layer 84 and conducting layer 92.

Polarized reflected light microscopy is a technique that is suitable for examining surfaces containing structures that alter the state of polarization during the reflection and/or light propagation process. For example, structural grains in ore samples and a number of metallic alloys and thin films can be readily examined, along with LC films, using this method. The illuminating wavefronts encounter a polarizer that is placed in the vertical illuminator before the beamsplitter that directs light into the objective. The linearly polarized light waves are focused onto the specimen/mirror surface and reflected back into the objective. After leaving the objective aperture as a parallel bundle of wavefronts, the light is then projected onto a second polarizer (the analyzer) oriented at 90 degrees with respect to the polarizer. Only the depolarized wavefronts are able to pass through the analyzer to reach the tube lens.

Figure 3A:
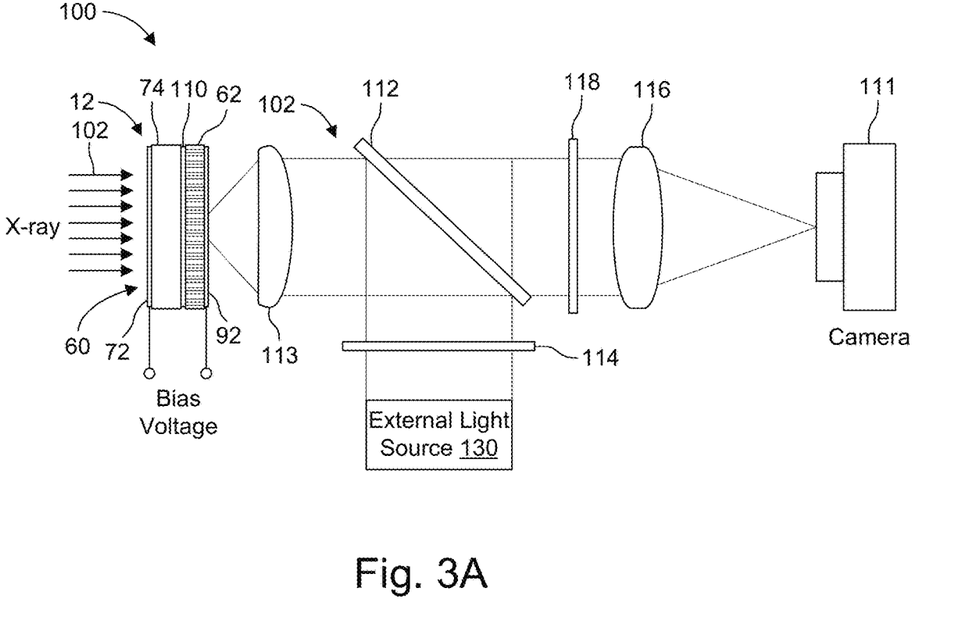
FIGS. 3A and 3B shows two x-ray detection systems employing polarized light optical microscope configurations, operating in reflection and transmission, respectively.
Figure 3B:
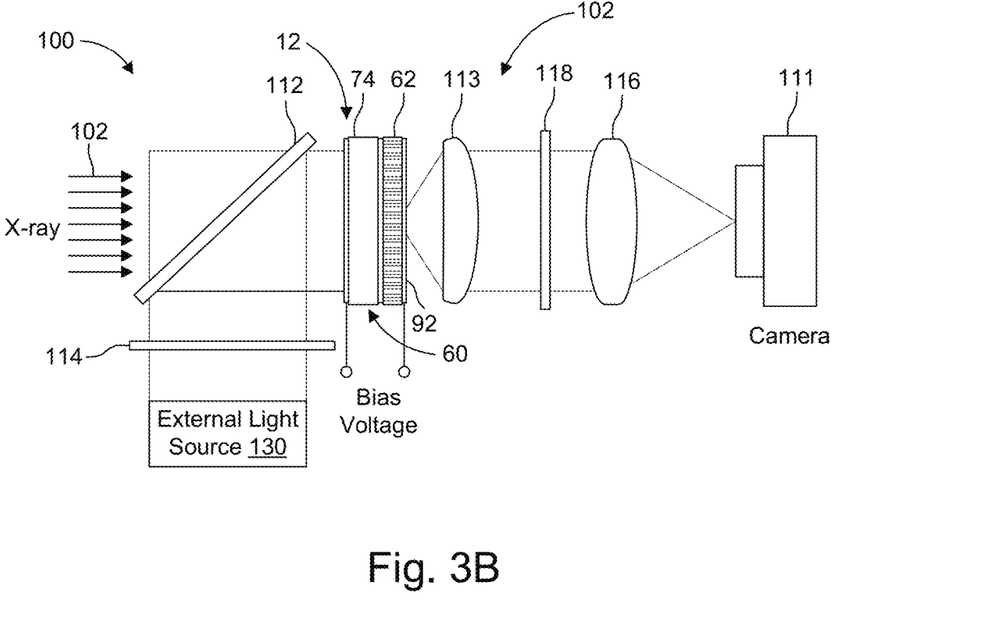

FIGS. 3A and 3B show two possible polarized light optical microscope-based x-ray detection systems 100.

In more detail, each of the x-ray detection systems 100 generally comprises the photoconductive x-ray detector 12 and a polarized light optical microscope 102. The photoconductive x-ray detector 12 manifests the x-ray projection of the x-rays 102 in its modulator 62. Then the polarized light optical microscope 102 reads-out that projection by interrogating the modulator 62 with polarized light.

In FIG. 3A, incoming x-rays or charged particle beam 102 are received in the photoconductor layer 74 of the photoconductive detector 60. The resulting electric charge forms the image in the modulator 62 of the photoconductive detector 12.

At the same time, the external light source 130 produces light. Examples of the external light source include light emitting diodes (LEDs), laser diodes and filtered incandescent lights. The light is polarized in a polarizer 114 and then reflected by a 50/50 beam splitter 112. The light is focused by objective lens 113 onto the modulator 62. The image recorded in the modulator 62 is manifest in the polarization rotation by the LC cell 80. This light is reflected by reflective layer 110 between the photoconductor layer 74 and the modulator 62. This reflective layer could be a dielectric thin film mirror. In other cases, the photoconductor layer 74 might be reflective to the wavelength of the light from the external source 130, making the reflective layer 110 unnecessary.

A portion of the reflected light passes through the beamsplitter 112 to a second polarizer 118, which functions as an analyzer. Tube lens 116 forms an image on the camera 111.

In FIG. 3B, the external light source 130 and the beamsplitter 112 are upstream of photoconductive detector 12. The external light is then transmitted through the photoconductive detector 12.

The transmission version shown in FIG. 3B is relatively simple, but prevents the detector 100 from being close to the x-ray or charged particle beam source. In the reflective mode show in FIG. 3A, an extra dielectric mirror 110 is placed onto the photoconductive detector layer 60. This dielectric mirror 110 reflects the detecting light back into the optical microscope system to detect the polarization changes in the LC layer. The properties of the dielectric mirror should not interfere the charge transport in the device. For this reason, metallic mirrors are not desired.

In an alternative setup to the transmission mode in FIG. 3B, the analyzer can be placed right after the glass substrate that supports the transparent electrode (or combined with the glass substrate to make a thin analyzer with a transparent electrode). This converts the polarization changes in the LC layer directly to light intensity changes before the light enters the light microscope. The advantage of this alternative is that the expensive and hard-to-get high-NA polarization objective can be replaced by an ordinary high-NA objective.

The lenses in the example diagrams are not limited to microscope objectives.

One important aspect of achieving high-resolution imaging and high detection efficiency is a method to identify and match the various factors in the detection process. Following the propagation of detection process, the major factors affecting the system resolution are:

Photoelectron range in the photoconductor materials. After the x-ray photons are absorbed, one or multiple photoelectrons are generated and they undergo ionization process and their energy is deposited along the path. It is desirable to have a short electron range and this range is primarily determine by the photon electron energy, photoconductor properties like density and other factors. High-density and high-Z materials will produce shorter electron range.

Figure 4:
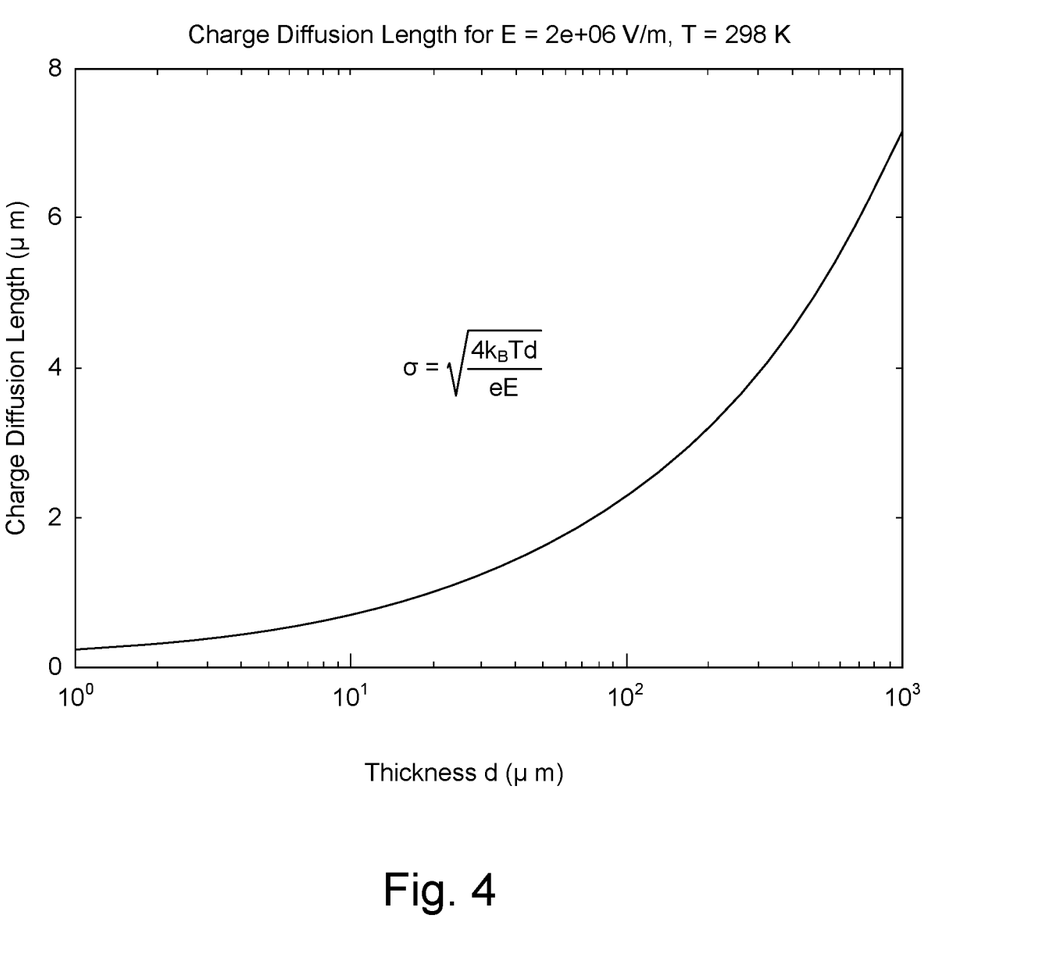
FIG. 4 shows charge diffusion length for different photoconductor thickness.

After the electron-hole pairs are generated along the photoelectron path, they will undergo both drift under the bias field and diffuse due to thermal excitations. A point charge cloud generated near one of electrode and being collected by the opposite electrode grows to the size $\sigma=\sqrt{4k_B Td/eE}$ along the 2D electrode plane, where $k_B T$ is the thermal energy, d is the photoconductor thickness, $e=1.602\times10^{-19}$ C. is the electron charge and E is the bias electric field. FIG. 4 shows the charge diffusion length for different photoconductor thickness for a field of 2V/μm. A thin photoconductor under higher bias field will has less time to diffuse and the diffusion length is shorter. However, a thin photoconductor will stop less x-ray photons; therefore, it will reduce the detection efficiency.

The liquid crystal layer will also affect the detection resolution. One aspect is electrical field spreading over the LC layer and it was discussed in MacDougall R D, Koprinarov I, Rowlands J A. The x-ray light valve: A low-cost, digital radiographic imaging system-Spatial resolution. *Medical Physics.* 2008:35(9):4216-4227. Another aspect is the liquid crystal director spread due to the fact that the liquid crystal is an elastic liquid and distortion in the director field at one location will spread out. It can be shown the length scales of both of these two effects are of the order of the cell thickness. Therefore, a thin LC layer of less than one micrometer will help in improving the detector resolution; however, the detector will be less sensitive to change of the accumulated charges and it could be difficult to manufacture very thin LC cells.

The optical detection resolution is primarily determined by the performance parameters of the microscopy objective. Among the parameters, the most important one is the numerical aperture (NA) and this is similar to other cases of microscopy. However, because higher NA objective will have a much smaller depth of focus, a matched LC layer thickness is required. This mean that for highest resolution imaging, the LC layer will be thin.

An optical camera, either CCD or CMOS, with matched pixel size is required to make sure the resolution is not deteriorated by the pixel size of the camera. However, the high quantum efficiency required by our current scintillator-based x-ray microscope system is generally not needed because an external light source can provide enough light.

For high x-ray stopping power application (thick photoconductor), the limiting factor is normally the charge spread. For high resolution imaging applications when photoconductor is made thin enough, the limiting factor is normally the optical resolution if the LC cell can be made thin enough and the LC cell sensitivity is enough. If LC cell has to be of a certain thickness due to technical limitations or LC sensitivity requirement, then LC thickness could be the limiting factor.

Figure 5:
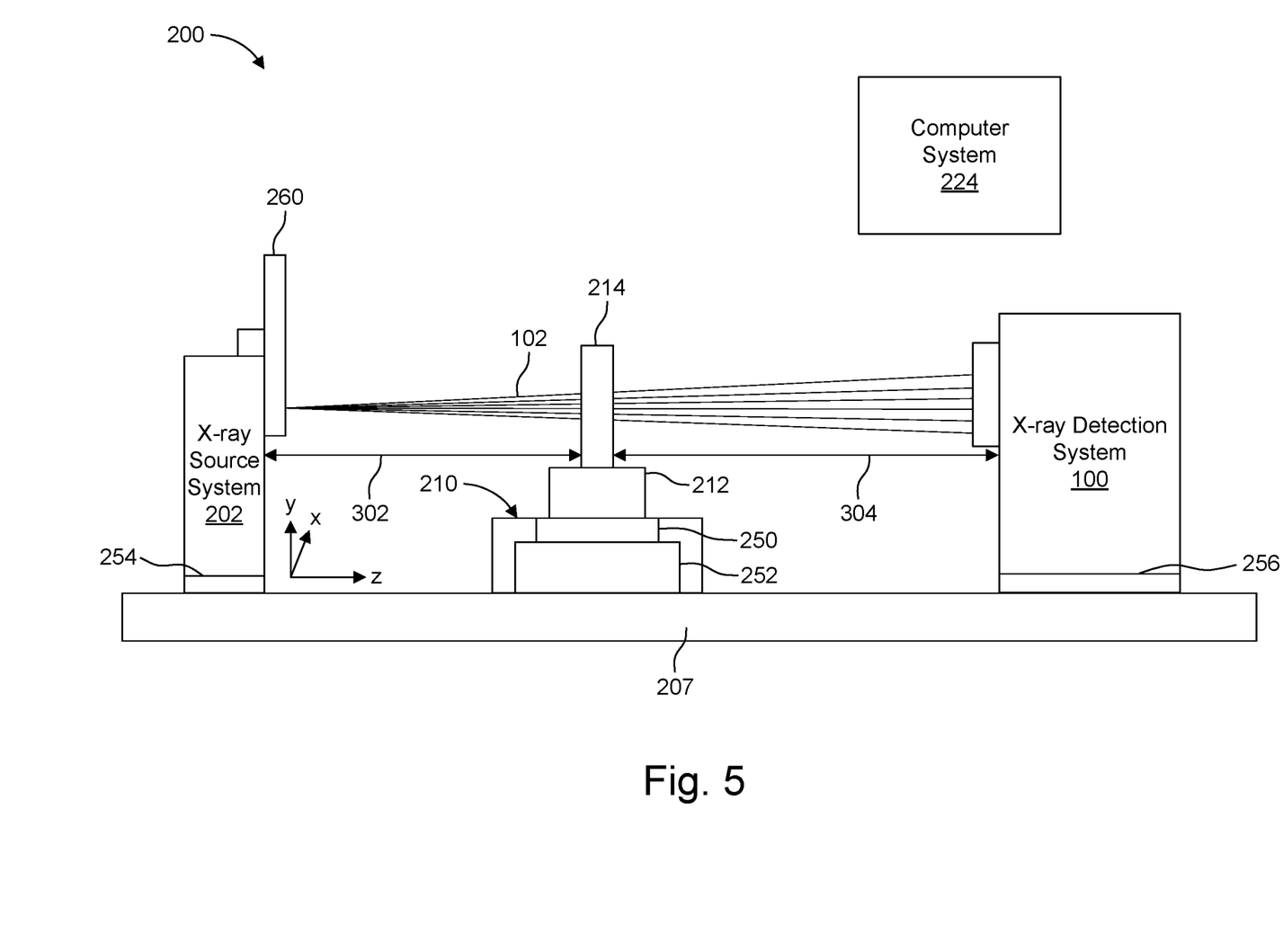
FIG. 5 is a schematic diagram of an x-ray microscope to which the present invention is applicable.

For context, FIG. 5 is a schematic diagram of an X-ray CT microscopy system 200 to which the x-ray detection systems 100 are applicable.

Nevertheless, the present invention is applicable to charged particle analysis systems and non-microscopy systems.

The microscope 200 generally includes an X-ray imaging system that has an X-ray source system 202 that generates a polychromatic or possibly monochromatic X-ray beam 102 and an object stage system 210 with object holder 212 for holding an object 214 and positioning it to enable scanning of the object 214 in the stationary beam 102. The x-ray detection system 100 detects the beam 102 after it has been modulated by the object 214. A base such as a platform or optics table 207 provides a stable foundation for the microscope 200.

In general, the object stage system 210 has the ability to position and rotate the object 214 in the beam 102. Thus, the object stage system 210 will typically include a precision 3-axis stage 250 that translates and positions the object along the x, y, and z axes, very precisely but over relatively small ranges of travel. This allows a region of interest of the object 214 to be located within the beam 102. The 3-stage stage 250 is mounted on a theta stage 252 that rotates the object 214 in the beam around the y-axis. The theta stage 252 is in turn mounted on the base 107.

The source system 102 will typically be either a synchrotron x-ray radiation source or alternatively a "laboratory x-ray source" in some embodiments. As used herein, a "laboratory x-ray source" is any suitable source of x-rays that is not a synchrotron x-ray radiation source. Laboratory x-ray source 202 can be an X-ray tube, in which electrons are accelerated in a vacuum by an electric field and shot into a target piece of metal, with x-rays being emitted as the electrons decelerate in the metal. Typically, such sources produce a continuous spectrum of background x-rays combined with sharp peaks in intensity at certain energies that derive from the characteristic lines of the selected target, depending on the type of metal target used. Furthermore, the x-ray beams are divergent and lack spatial and temporal coherence.

In one example, source 202 is a rotating anode type or microfocused source, with a Tungsten target. Targets that include Molybdenum, Gold, Platinum, Silver or Copper also can be employed. Preferably a transmission configuration is used in which the electron beam strikes the thin target from its backside. The x-rays emitted from the other side of the target are used as the beam 102.

The x-ray beam generated by source 202 is preferably conditioned to suppress unwanted energies or wavelengths of radiation. For example, undesired wavelengths present in the beam are eliminated or attenuated, using, for instance, energy filters (designed to select a desired x-ray wavelength range (bandwidth)) held in a filter wheel 260. Conditioning is also often provided by collimators or condensers and/or an x-ray lens such as a zone plate lens.

When the object 214 is exposed to the X-ray beam 102, the X-ray photons transmitted through the object form a modulated x-ray beam that is received by the detection system 100. In some other examples, a zone plate objective x-ray lens is used to form an image onto x-ray detection system 100.

Typically, a magnified projection image of the object 214 is formed on the detection system 100. The magnification is equal to the inverse ratio of the source-to-object distance 302 and the source-to-detector distance 304.

Typically, the x-ray source system 202 and the detection system 100 are mounted on respective z-axis stages. For example, in the illustrated example, the x-ray source system 202 is mounted to the base 207 via a source stage 254, and the detection system 100 is mounted to the base 207 via a detector stage 256. In practice, the source stage 254 and the detector stage 256 are lower precision, high travel range stages that allow the x-ray source system 202 and detection system 100 to be moved into position, often very close to the object during object scanning and then be retracted to allow the object to be removed from, a new object to be loaded onto, and/or the object to be repositioned on the object stage system 210.

The operation of the system 200 and the scanning of the object 214 is controlled by a computer system 224 that often includes an image processor subsystem, a controller subsystem. The computer system is used to readout the optical image detected by the camera 111 of the detection system 100. The computer system 224, with the possible assistance of its image processor, accepts the set of images from the detection system 100 associated with each rotation angle of the object 214 to build up the scan. The image processor combines the projection images using a CT reconstruction algorithm to create 3D tomographic volume information for the object. The reconstruction algorithm may be analytical, where convolution or frequency domain filtering of the projection data is combined with back projection onto a reconstruction grid. Alternatively, it may be iterative, where techniques from numerical linear algebra or optimization theory are used to solve a discretized version of the projection process, which may include modeling of the physical properties of the imaging system.

While this invention has been particularly shown and described with references to preferred embodiments thereof, it will be understood by those skilled in the art that various changes in form and details may be made therein without departing from the scope of the invention encompassed by the appended claims.

What is claimed is:

1. A detection system for an imaging system, comprising:
a photoconductive detector comprising a spatial light modulator and photoconductive detector layer forming a sandwich structure;
an optical microscope for reading out the photoconductive detector; and
a camera for reading out the spatial light modulator via the optical microscope, wherein a charge relaxation time of the photoconductive detector is less than a time interval between consecutive image frames captured by the camera.

2. A detection system as claimed in claim 1, wherein the imaging system is an x-ray microscopy system.

3. A detection system as claimed in claim 1, wherein the photoconductive detector detects x-rays.

4. A detection system as claimed in claim 1, wherein the photoconductive detector detects charged particles of a charged particle beam.

5. The detection system as claimed in claim 1, wherein the spatial light modulator is a liquid crystal light valve.

6. The detection system as claimed in claim 5, wherein the photoconductive detector layer comprises bismuth, lead, thallium, mercury, tellurium, antimony, or tin.

7. The detection system as claimed in claim 1, wherein the optical microscope is a polarization light microscope.

8. The detection system as claimed in claim 1, wherein the optical microscope reads-out the photoconductive detector in transmission.

9. The detection system as claimed in claim 1, wherein the optical microscope reads-out the photoconductive detector in reflection.

10. The detection system as claimed in claim 1, wherein the optical microscope includes objective lens followed by a tube lens.

11. The detection system as claimed in claim 1, wherein the photoconductive detector comprises a mirror layer.

12. An analysis system, comprising
a source for generating a beam;
an object stage system for holding and rotating an object in the beam; and
a detection system including:
a photoconductive detector comprising a spatial light modulator and photoconductive detector layer forming a sandwich structure,
an optical microscope for reading out the photoconductive detector; and
a camera for reading out the spatial light modulator via the optical microscope, wherein a charge relaxation time of the photoconductive detector is less than a time interval between consecutive image frames captured by the camera.

13. The analysis system as claimed in claim 12, wherein the source is an x-ray source.

14. The analysis system as claimed in claim 12, wherein the source in is a particle beam source.

15. The analysis system as claimed in claim 12, wherein the spatial light modulator is a liquid crystal light valve and photoconductive detector layer.

16. The analysis system as claimed in claim 15, wherein the photoconductive detector layer comprises bismuth, lead, thallium, mercury, tellurium, antimony, or tin.

17. The analysis system as claimed in claim 12, wherein the optical microscope is a polarization light microscope.

18. The analysis system as claimed in claim 12, wherein the optical microscope reads-out the photoconductive x-ray detector in transmission.

19. The analysis system as claimed in claim 12, wherein the optical microscope reads-out the photoconductive x-ray detector in reflection.

20. The analysis system as claimed in claim 12, wherein the optical microscope includes objective lens followed by a tube lens.

* * * * *